(12) United States Patent
Bilic et al.

(10) Patent No.: US 10,804,703 B2
(45) Date of Patent: Oct. 13, 2020

(54) WAVEFORM SEPARATOR APPARATUS AND METHOD FOR DETECTING LEAKAGE CURRENT IN HIGH VOLTAGE DIRECT CURRENT POWER SYSTEMS

(71) Applicant: Quanta Associates, L.P., Houston, TX (US)

(72) Inventors: Zoran Bilic, Winnipeg (CA); David James Ball, Houston, TX (US)

(73) Assignee: Quanta Associates, L.P., Houston, TX (US)

( * ) Notice: Subject to any disclaimer, the term of this patent is extended or adjusted under 35 U.S.C. 154(b) by 242 days.

(21) Appl. No.: 15/829,655

(22) Filed: Dec. 1, 2017

(65) Prior Publication Data
US 2018/0159331 A1     Jun. 7, 2018

Related U.S. Application Data

(60) Provisional application No. 62/429,459, filed on Dec. 2, 2016.

(30) Foreign Application Priority Data

Dec. 2, 2016 (CA) ...................................... 2950506

(51) Int. Cl.
*G01R 19/00* (2006.01)
*H02J 3/36* (2006.01)
(Continued)

(52) U.S. Cl.
CPC ............ *H02J 3/36* (2013.01); *G01R 19/0015* (2013.01); *G01R 19/16528* (2013.01);
(Continued)

(58) Field of Classification Search
CPC .......... G01R 19/16528; G01R 19/0015; G01R 31/50; H02J 3/36
See application file for complete search history.

(56) References Cited

U.S. PATENT DOCUMENTS 4,833,415 A * 5/1989 Nourai ................. G01R 31/025
324/551
5,638,057 A    6/1997 Williams
(Continued)

OTHER PUBLICATIONS

Blaine R. Copenheaver, PCT Written Opinion of the International Searching Authority, dated Mar. 8, 2018, 9 pages, ISA/US, Alexandria, Virginia, United States.
(Continued)

*Primary Examiner* — Dominic E Hawkins
(74) *Attorney, Agent, or Firm* — Oathout Law Firm; Mark A. Oathout; Antony C. Edwards

(57) ABSTRACT

A waveform separator system for determining DC leakage current flowing through an insulating structure in a high voltage direct current power system, wherein the DC leakage current is a composite DC current comprising one or more high magnitude momentary spikes, and having a DC component and an AC component includes: (1) a waveform separator configured to receive the composite DC current flowing through the insulating structure and to separate the composite DC current into corresponding direct current (DC) and alternating current (AC) components wherein the AC component has a first rate of change, and wherein the DC component has a second rate of change, and wherein the first rate of change is greater than the second rate of change; (2) at least one comparator configured to receive the AC component and produce at least one corresponding digital signal; and (3) a processor configured to: (a) receive the at least one corresponding digital signal and the DC component, (b) analyze the at least one corresponding digital signal and the DC component, and; (c) determine a resultant leakage current flowing through the insulating structure.

18 Claims, 13 Drawing Sheets

Leakage current

(51) Int. Cl.
*G01R 31/50* (2020.01)
*G01R 19/165* (2006.01)
*G08B 21/02* (2006.01)

(52) U.S. Cl.
CPC .............. *G01R 31/50* (2020.01); *G08B 21/02* (2013.01); *Y02E 60/60* (2013.01)

(56) References Cited

U.S. PATENT DOCUMENTS

| | | | |
|---|---|---|---|
| 5,872,457 A | 2/1999 | Williams | |
| 6,421,618 B1* | 7/2002 | Kliman | G01R 31/025 324/500 |
| 9,535,105 B2* | 1/2017 | Phillips | G01R 31/1245 |
| 2004/0070668 A1* | 4/2004 | Abe | H04N 5/23241 348/65 |
| 2005/0094336 A1* | 5/2005 | Cleveland | H02G 3/00 361/64 |
| 2008/0157752 A1* | 7/2008 | Lu | G01R 15/146 324/140 R |
| 2012/0249067 A1 | 10/2012 | Hein et al. | |
| 2014/0347897 A1* | 11/2014 | Broussard | H02J 3/36 363/35 |

OTHER PUBLICATIONS

Blaine R. Copenheaver, PCT International Search Report, dated Mar. 8, 2018, 3 pages, ISA/US, Alexandria, Virginia, United States.
M. Roman et al., Insulator Leakage Current Monitoring: Challenges for High Voltage Direct Current Transmission Lines, 2014 International Conference on the Eleventh industrial and Commercial Use of Energy, Aug. 19, 2014, 7 pages, IEEE, Cape Town, South Africa.

* cited by examiner

WAVEFORM SEPARATOR APPARATUS AND METHOD FOR DETECTING LEAKAGE CURRENT IN HIGH VOLTAGE DIRECT CURRENT POWER SYSTEMS

CROSS REFERENCE TO RELATED APPLICATIONS

This application claims priority from U.S. Provisional Patent Application No. 62/429,459 filed Dec. 2, 2016 and Canadian Patent Application No. 2,950,506 filed Dec. 2, 2016, both entitled "Waveform Separator Apparatus and Method for Detecting Leakage Current in High Voltage Direct Current Power Systems".

FIELD

Embodiments described herein relate to an apparatus and method for measuring leakage current and, more particularly, to an apparatus and method for measuring leakage current flowing through insulating structures in high voltage direct current power systems.

BACKGROUND

Electrical power systems comprise several insulating structures, for example outdoor insulators. Energized lines are supported from support structures such as poles or towers by means of outdoor insulators. Such insulators are made of dielectric material such as porcelain, glass or other suitable material. These insulators tend to deteriorate over a period of time. One of the main causes for insulator deterioration is dielectric contamination. Outdoor insulators are continuously exposed to the environment and contaminants such as salt, dust, sand and other industrial pollutants tend to deposit or build-up on the insulator surface as a dry layer. The dry contaminant layer becomes conductive under light wetting conditions such as light rain or morning dew thereby reducing the dielectric performance of the insulator. Since one end of the insulator is energized, and the other end is grounded, reduced dielectric performance results in current flowing through the insulator to the ground. This current is typically referred to as leakage current. When the contamination is severe, leakage current can reach unacceptably high levels. When the leakage current exceeds a highest permissible value for a particular voltage class, it may result in a condition referred to as flashover. Flashovers create high temperature electrical arcs which may endanger line personnel, cause power outages and damage equipment.

Measurement and analysis of leakage current flowing through an outdoor insulator may be used to determine insulator degradation and consequently predict a flashover condition. Typically, a peak or RMS value of the leakage current is determined. This value is then correlated with flashover voltages to predict flashover. In an attempt to prevent flashover, leakage current flowing through insulators is periodically measured and analyzed.

Other predominant insulating structures in an electrical power system include an aerial boom or other support structures such as scaffolding, ladders or lattice towers. These structures enable workers to reach the overhead energized lines for conducting barehand work on the energized lines. Such structures include electrically insulating sections, which ensure that there is no electrical path from the energized lines to ground. The insulating structures allow a worker to work directly on the energized lines. If the electrical resistance of such insulating structures breaks down due to factors stated above, a worker could experience electric shock and injury.

There are several methods for detecting flow of leakage current through such insulating structures. Some known methodologies involve de-energizing the transmission line prior to testing. The methodologies discussed herein are directed to detection under live-conditions. In other words, the transmission lines are energized and not de-energized prior or during detection.

In conventional high voltage alternating current (AC) power systems, leakage current through insulating structures may be measured using AC multimeters such as those made by Fluke™ and a variety of other manufacturers. Such AC multimeters may be operably coupled to an insulator through electrical leads for measuring leakage current flowing through the insulator.

In recent years, transmission of power using high voltage direct current (HVDC) technology has been accepted as an alternative to conventional AC power systems. Insulating structures used in HVDC power systems are also susceptible to the dielectric degradation outlined above. However, due to fundamental differences between alternating current and direct current (bi-directional vs. unidirectional respectively), AC current measuring devices used in AC power systems for detection of leakage current cannot be safely used in a HVDC system.

A scientific paper titled "Insulator Leakage Current Monitoring: Challenges For High Voltage Direct Current Transmission Lines" by M. Roman et al. articulates the differences between AC and direct current (DC) power systems. It also corroborates that there is no direct mapping between AC and DC leakage current measurement devices.

DC meters for the measurement of leakage currents in low power applications, for example under 6 kv, are known. The sampling rate of such DC meters may be typically in the range of 60 to 100 Hz.

During Applicant's attempts to measure leakage current in HVDC systems, Applicant observed that leakage current is a composite DC current comprising transient spikes or discharges. Such discharges are high in magnitude and may be best described as "short duration" or "momentary" or "very narrow" spikes. In other words, the discharges are high in magnitude but typically extremely short in duration. Typically, such spikes have been observed by Applicant to have duration of less than a microsecond to a few hundredths of a second depending upon the energy of the spike. The greater the amplitude and duration, higher the energy. High energy spikes that exist for hundredths of a second are dangerous and represent an immediate risk of flashover. For this reason the lower energy short duration spikes are most critical to detect as they provide a safer and early warning.

In Applicant's experience, as the spikes are momentary, conventional DC meters do not react to such spikes and the spikes are not registered. Applicant believes that in order to capture such momentary spikes, conventional DC meters would have to be modified so that they have significantly higher than conventional sampling rates, for example, at least 10,000 samples/second (10 KHz). In addition these recorded spikes would need to be cataloged, and displayed to a user in a meaningful and timely way.

Therefore, there is a need for a relatively simple and inexpensive DC leakage current detecting apparatus or meter, without the need for a very high sampling rate, may be used with several types of electrically insulating structures in HVDC systems to indicate accurately leakage current voltage spikes flowing through such structures and display detected leakage current in a meaningful and timely way to an operator or user.

SUMMARY

DC leakage current consists entirely of fast DC transients (spikes). Leakage current spikes are random in occurrence, amplitude and duration. Polarity of these transients depends on the polarity of DC transmission line. The average value (DC) of these spikes depends on their occurrence, amplitude and width. Duration of the spikes is dominantly very short, in range of few microseconds or less. A sampling Analog/ Digital converter (ADC) cannot accurately sample leakage current without an extremely high sample rate, probably in 100 Ks/sec, which likely would not be practically possible. Knowing both average value of the spikes and their number/ sec gives us an indication of incoming catastrophic breakdown/flashover. In the present invention leakage current is separated into two components using analog filters and amplifiers. The DC component is sampled by a microcontroller ADC at a fairly low rate and further processed. The AC components are digitized by a voltage comparator, and in particular there are positive and negative current spike comparators. The comparators threshold level is adjustable and gives 0-5V pulses proportional to the leakage current spikes. A microprocessor counts pulses coming from the comparators. Only one of the comparators produces digital output pulses. Which comparator depends on the polarity of the leakage current. This provides for measurement of either polarity of the leakage current without swapping input or having to switch.

Accordingly in one aspect, a waveform separator system for determining DC leakage current flowing through an insulating structure in a high voltage direct current power system is provided. The DC leakage current is a composite DC current comprising one or more high magnitude momentary spikes, and having a DC component and an AC component. The system comprises a waveform separator configured to receive the composite DC current flowing through the insulating structure and to separate the composite DC current into corresponding direct current (DC) and alternating current (AC) component. The AC component has a first rate of change, and the DC component has a second rate of change. The first rate of change is greater than the second rate of change. The system further comprises at least one comparator configured to receive the AC component and produce at least one corresponding digital signal. The system also includes a processor configured to: (a) receive the at least one corresponding digital signal and the DC component, (b) analyze the at least one corresponding digital signal and the DC component, and (c) determine a resultant leakage current flowing through the insulating structure.

Accordingly in another aspect, a method for determining DC leakage current flowing through an insulating structure in a high voltage direct current power system is provided. The DC leakage current is a composite DC current comprising one or more high magnitude momentary spikes, and having DC components and AC components. The method comprises separating the composite DC current into its slow-moving direct current (DC) component and fast-moving alternating current (AC) component. The method also comprises analyzing the fast-moving AC component and producing at least one digital signal corresponding to the fast-moving AC component. Further, the method comprises analyzing the at least one corresponding digital signal and the slow-moving DC component for determining a resultant leakage current flowing through the insulating structure.

Accordingly in another aspect, a method for determining DC current leaking through a dielectric material is provided. The dielectric material is electrically coupled to an energized power line conducting DC current. The DC current leaking through the dielectric material is a composite DC current comprising one or more high magnitude momentary spikes, and having a DC component and an AC component. The method comprises separating the composite DC current into its direct current (DC) component and alternating current (AC) component. The method also comprises analyzing the AC component and producing at least one digital signal corresponding to the AC component. Further, the method comprises analyzing the at least one corresponding digital signal and the DC component for determining a resultant DC current leaking through the dielectric material.

Accordingly in another aspect, a process is provided. The process comprises providing an energized DC electrical line above an Earthen surface. The process also comprises locating a first end of a substantially electrically insulating member proximate the energized DC electrical line and locating a second end of the substantially electrically insulating member proximate the Earthen surface. In addition, the process comprises providing, in series between the insulating member and the Earthen surface, a DC current meter for measuring a composite DC current leaking through the insulating member. Further, the process comprises determining a resultant leakage current passing through the insulating member using the DC current meter.

DETAILED DESCRIPTION OF PREFERRED EMBODIMENTS

The following paragraphs describe an apparatus to accurately measure, indicate and process leakage current flowing through insulating structures in an energized high voltage direct current (HVDC) power system. Examples of insulating structures include, but are not limited to, outdoor insulators, aerial booms, insulating scaffolding, insulating hot sticks, hydraulic lines, fiber optic cables or any other structure which may be designed and known to be an insulating structure to the extent its material permits it to be dielectric, insulating or insulative.

Figure 1:
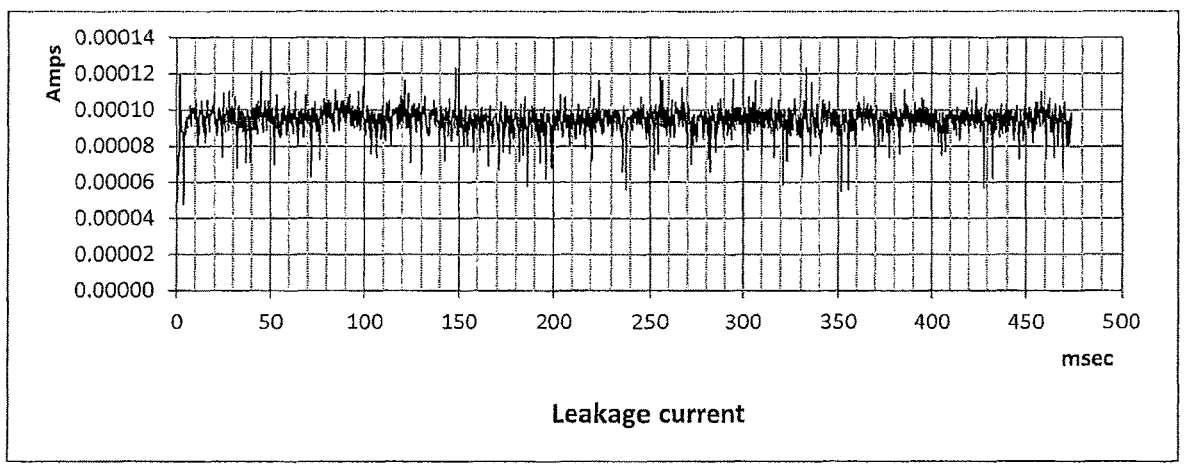
FIG. 1 is a representative waveform of a composite DC current flowing through an insulating structure in a HVDC system.

As explained in the Background above, Applicant has observed that DC current leaking through insulating structures in HVDC systems is in the form of a composite DC current containing one or more high magnitude "short duration" or "momentary" or "very narrow" random spikes. A waveform representative of the composite DC current flowing through such insulating structures is illustrated in FIG. 1.

Figure 2:
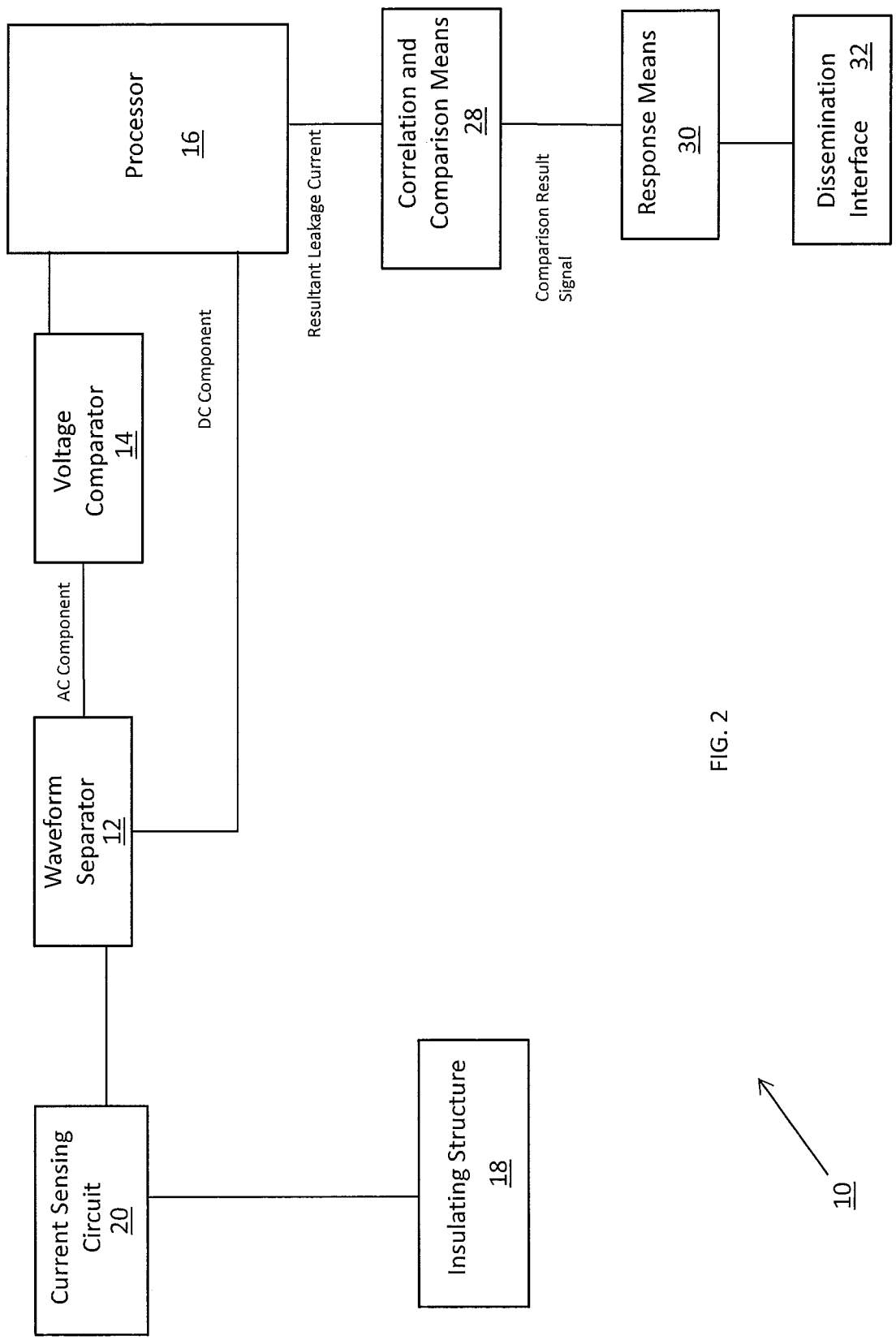
FIG. 2 is a block diagram illustrating one embodiment of an apparatus for measuring leakage current flowing through an insulating structure in a high voltage direct current (HVDC) power system.
Figure 3:
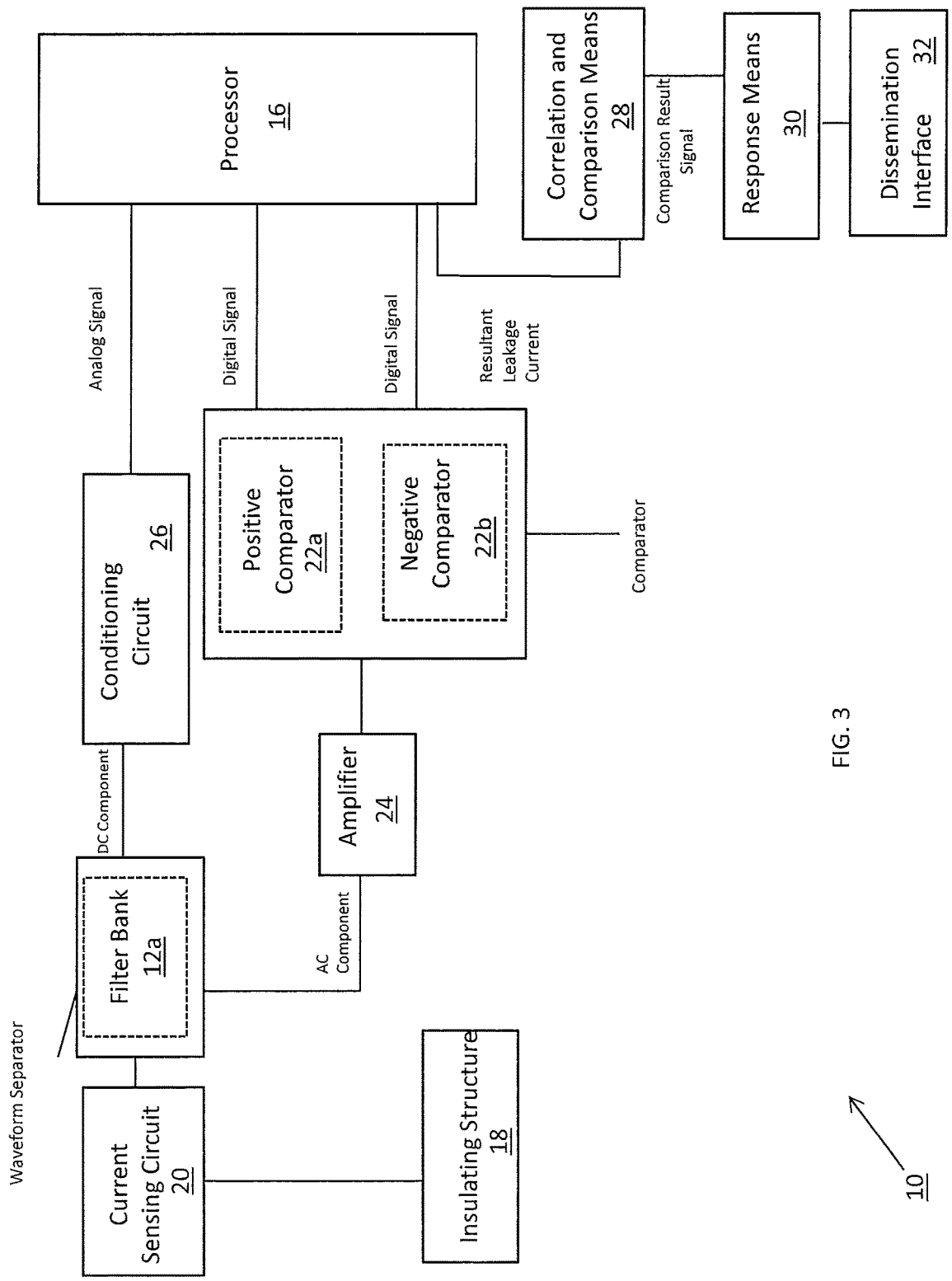
FIG. 3 is a block diagram illustrating further details of the apparatus of FIG. 1.

With reference to FIGS. 2 and 3, apparatus 10 comprises a waveform separator 12, at least one voltage comparator 14 and a processor 16. The waveform separator 12 is configured to receive the composite DC current flowing through an insulating structure 18 in a HVDC system. In one embodiment and with reference to FIGS. 2 and 3, a current sensing circuit 20 may be used to measure the composite DC current leaking through the insulating structure 18. The current sensing circuit 20 is operatively coupled to the insulating structure 18 and the waveform separator 12. Examples of the current sensing circuit 20 include, and are not limited to one or more high precision shunts or shunt resistors (not shown) which receive the composite DC current and output a voltage corresponding to the received composite DC current. The one or more shunt resistors may be associated with one or more amplifiers which amplify the voltage across the one or more shunt resistors to a level that enables further processing by the waveform separator 12.

Current measurements may be taken or measured at almost any frequency, such as from 10 measurements per second to 1000 or more measurements per second.

As will be explained in detail in the following paragraphs, the insulating structure 18 may comprise a single insulating structure or multiple insulating structures. In the case of multiple insulating structures, in one embodiment, an electrical collection point may be established and composite DC current leaking through the electrical collection point may be sensed for conduction to the waveform separator 12 for further processing.

Figure 4A:
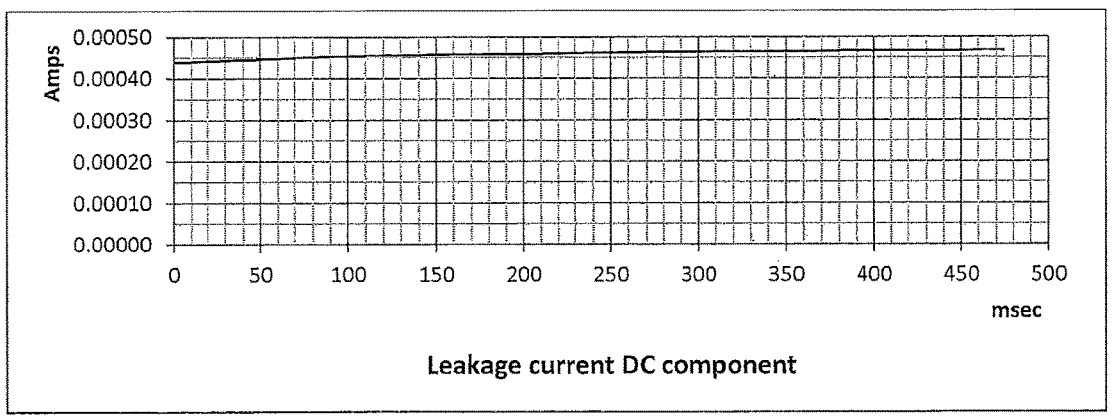
FIGS. 4a and 4b are representative waveforms of the DC and AC components of a composite DC current leaking through the insulating structure and being processed by the apparatus of FIGS. 2 and 3, FIG. 4a diagrammatically representing the nature of the DC component of the composite DC current and FIG. 4b diagrammatically representing the nature of the AC component of the composite DC current.
Figure 4B:
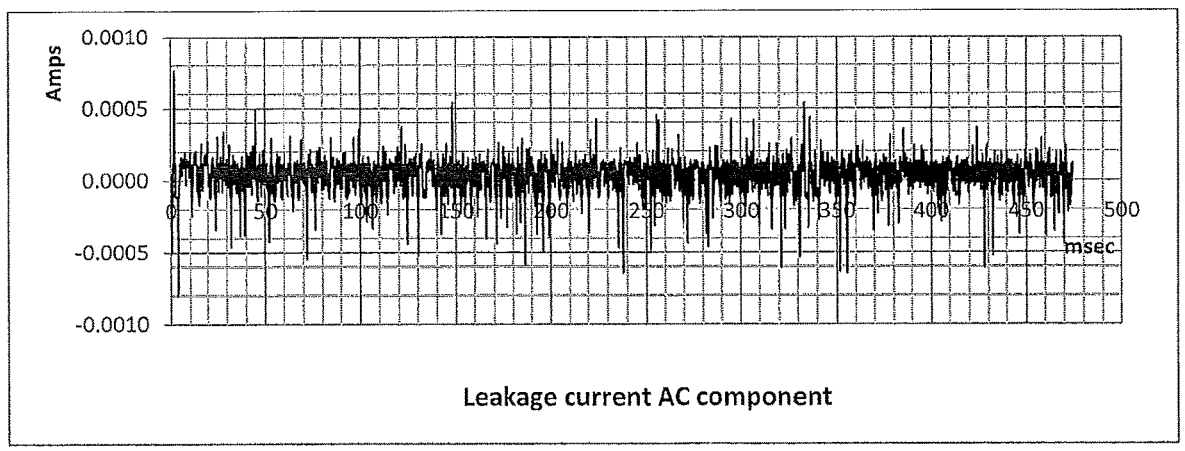

FIGS. 4a and 4b diagrammatically represent the nature of the DC component and the AC component of the composite DC current, respectively. The AC component may be described as having a first rate of change and the DC component may be described as having a second rate of change. The rate of change of the AC and DC components depends on a multitude of factors including voltage class of the DC power line, dielectric properties of the insulating structure or dielectric contamination of the insulating structure. However, in most cases, the rate of change of the AC component (the first rate of change) is greater and usually significantly greater, than the rate of change of the DC component (the second rate of change). The DC component is usually steady or substantially steady and thus does not substantially change during the measurement process. In other words, the rate of change of the DC component, namely, the second rate of change is very low. As seen in FIG. 4b, the AC component rapidly ramps up and down and hence the AC component has been described herein as fast-moving or fast-changing. On the other hand, the DC component does not change as fast as the AC component or changes at a slow rate as seen in FIG. 4a. Therefore, the DC component has been described as slow-moving or slow-changing.

The waveform separator 12 separates the sensed composite DC current into its slow-changing or slow-moving DC component and fast-changing or fast-moving AC component. FIGS. 4a and 4b illustrate the nature of the DC and AC components respectively. The AC component may have a waveform which is sinusoidal, rectangular, triangular or the like. In one embodiment, the waveform separator 12 comprises one or more high pass and low pass filters forming a filter bank. High pass and low pass filters are of known construction. The filter bank is collectively indicated by reference numeral 12a in FIG. 3.

Figure 5A:
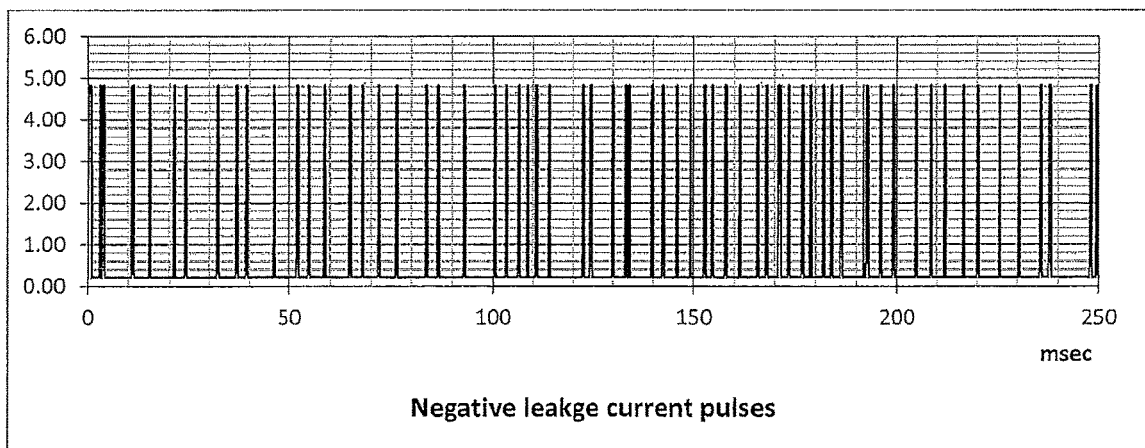
FIGS. 5a and 5b are representative waveforms of the negative and positive pulses of the AC component of FIG. 4b, FIG. 5a representing the negative pulses and FIG. 5b representing the positive pulses.
Figure 5B:
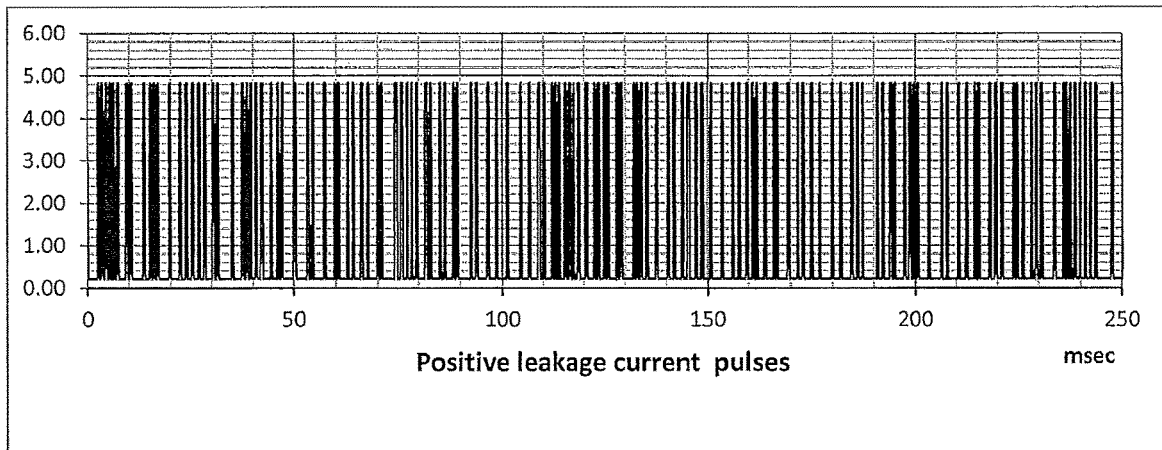

The AC component is received by the at least one voltage comparator 14 that provides a digital signal corresponding to the received AC component. The AC component typically comprises negative and positive components. FIGS. 5a and 5b illustrate the nature of the negative and positive components contained in the AC component of the composite DC current. Accordingly, in a preferred embodiment, the apparatus 10 comprises two voltage comparators, a positive voltage comparator 22a and a negative voltage comparator 22b (FIG. 3). The positive voltage comparator 22a generates a digital signal representative of the positive AC components. The negative voltage comparator 22b generates a digital signal representative of the negative AC components.

In one embodiment, before the AC component is fed to the positive and negative voltage comparators 22a and 22b they may be conditioned. Conditioning may include amplification of the AC component. In a preferred embodiment and as seen in FIG. 3, the apparatus comprises an amplifier 24 for amplifying the AC component.

The DC component may also be conditioned before it is received by the processor 16. Conditioning may include filtering, amplification or averaging or any combination thereof. The various components of such conditioning circuits are well-known and such circuits are collectively indicated by reference numeral 26 in FIGS. 2 and 3.

The processor 16 receives the DC component and the digital signals representative of the positive and negative AC components for further processing. Since the output of the conditioning circuit 26 processing the DC components is an analog signal, such analog signal must be digitized before it can be processed by the processor 16. Such digitization is generally carried out using an analog-to-digital converter (ADC). The ADC may be separate or the processor 16 may be equipped with its own built-in ADC.

In one embodiment, the processor 16 receives a digital signal representative of the DC component and the digital signals corresponding to the AC positive and negative components and analyzes these to generate a resultant leakage current value flowing through the insulating structure 18. Resultant leakage current calculation is carried out by the processor 16 using known techniques, for example averaging techniques.

In some embodiments, the apparatus 10 may be used to alert workers of changes in the resultant leakage current and/or if the resultant leakage current is within an impermissible range so that the workers may take immediate preventive actions to save themselves and/or related equipment. Accordingly, in some embodiments, the apparatus 10 further comprises a correlation and comparison means 28 for determining a correlation component or parameter value from the resultant leakage current. Herein, the terms "correlation component" and "parameter value" are used interchangeably. In a preferred embodiment, the correlation component is a peak leakage value or RMS value of the resultant leakage current. The correlation component may be any predetermined quantity of the monitored and processed composite DC current, the resultant leakage current. The peak leakage current value may then be compared against a threshold to generate a comparison result signal. The threshold may be representative of fault conditions such as an impending flashover condition. The threshold may be historic values or values derived through experimentation. The comparison result signal may be received by a response means 30 for dissemination of the comparison result signal in one or more forms or a combination of one or more forms. In order to do so, the response means 30 may be associated with one or more dissemination interfaces 32. The comparison signal may be disseminated in a visual or audio or vibratory form or any combination of such forms, or, for example, other forms of haptic, tactile or sensory feedback. The dissemination interface 32 may be any known interface capable of disseminating data, either locally or remotely, or both.

The correlation and comparison means 28 and response means 30 may be modules of the processor 16, such as on the same integrated circuit device, or they may for example be closely coupled auxiliary circuits or chips.

For easy of portability, in one embodiment most components of the apparatus of FIGS. 2 and 3 are located within a casing or housing 34 (FIG. 6) that is configured to be coupled to the insulating structure 18. The processor 16 and memory accessible to the processor providing current measurement and processing described herein may be provided in the housing 34, or such processor may be external to the housing 34 and coupled to the housing 34 for back and forth data communication. The processor 16 may be part of a computer system, or other microprocessor-based system. Although one processor is described, multiple processors may be provided and programmed to enable the leakage current measurement and processing herein, and such processors may be present in the housing 34 with the one or more other components of the apparatus 10, or the computer system, or both.

The one or more interfaces 32 for disseminating the comparison result signal may be arranged or positioned within and around a surface of the housing 34.

Figure 6:
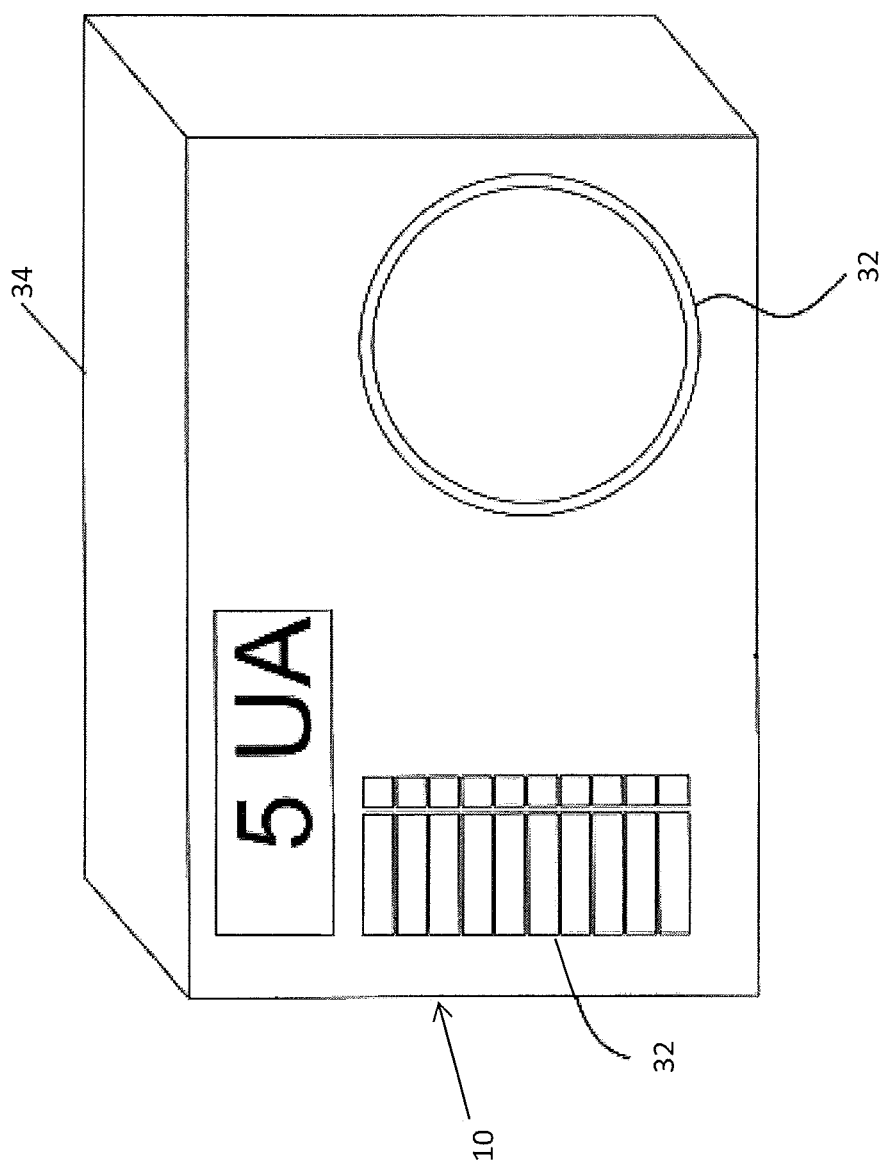
FIG. 6 is a perspective external view of the apparatus of FIG. 2 encased within a casing or housing to promote portability.

FIG. 6 is an external view of the apparatus 10 with most of the operative components enclosed within. As stated above, by enclosing the components of the apparatus 10 within the housing 34, the portability of apparatus 10 is enhanced. FIG. 6 is one example of how one or more dissemination interfaces 32 may be arranged or positioned within and around a surface of the housing 34. In this example, the one or more dissemination interfaces include an LCD display, an audio speaker and a graphical display for displaying the resultant leakage current or any predetermined quantity of the resultant leakage current.

Figure 7:
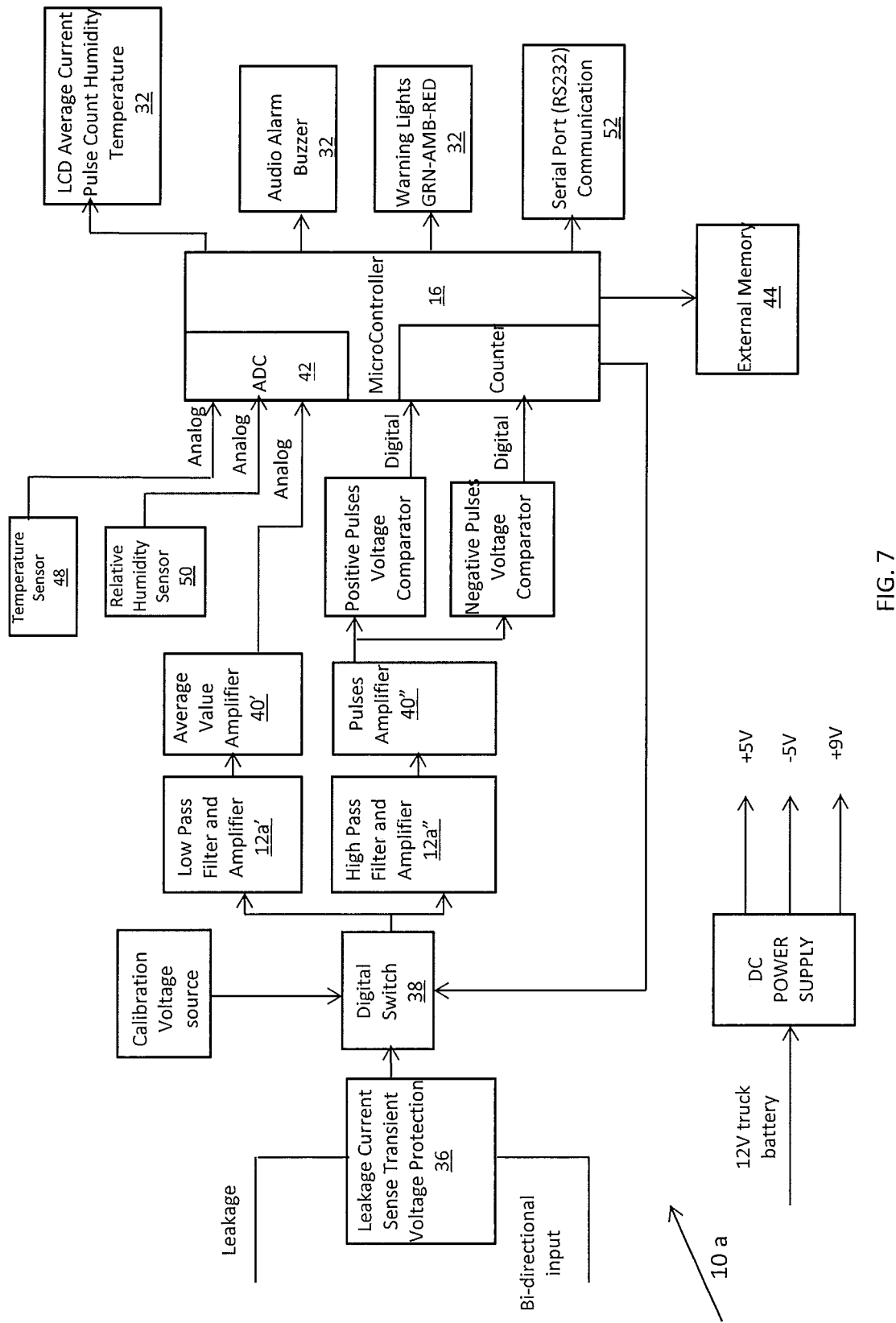
FIG. 7 is a block diagram of a proposed prototype embodiment of the apparatus of FIGS. 2 and 3.

FIG. 7 is a block diagram of one embodiment showing operative components of a proposed prototype 10*a* of the apparatus 10. The prototype 10*a* includes the operative components illustrated in FIGS. 2 and 3, and such corresponding operative components are designated by the same reference numerals as in FIGS. 2 and 3. Most operative components of the prototype 10*a* are located in a casing such as housing 34. Composite DC current leaking through an insulating structure flows into the apparatus 10 through a transient voltage protector device 36 which protects all electrical downstream components from a power surge. The prototype 10*a* further comprises a switch 38 for changing the processor 16 from its normal or "run" setting to its calibration setting and vice versa. The filter bank 12*a* of the waveform separator 12 includes a low pass filter 12*a*' and a high pass filter 12". The low pass and high pass filters are associated with corresponding amplifiers, 40' and 40". The DC component is filtered out by the low pass filter 40' and the AC component is filtered out by the high pass filter 40". Outputs of the two filters are amplified prior to further processing. The output of amplifier 40" is fed to positive and negative voltage comparators, 22*a* and 22*b*, which in turn generate digital signals corresponding to the positive and negative components contained in the AC part of the composite DC current. The output of amplifier 40' (amplified DC component) is an analog signal. The digital signals corresponding to the AC component and the analog signal corresponding to the DC component are received by the processor 16 for further processing. The processor 16 of the prototype 10*a* has an in-built ADC 42 which receives the analog signal corresponding to the DC component and digitizes the same. The input signals are processed by the processor 16 to determine a resultant leakage current using methodologies well known in the art. The processor 16 of the prototype 10*a* is associated with an external memory 44 for storing information relating to the resultant leakage current and/or its associated components. The prototype 10*a* also comprises one or more dissemination interfaces arranged around an external surface of the housing 34. The dissemination interfaces 32 associated with the prototype include an audio speaker and LCD displays. As state above, the interfaces may be used to alert a worker of changes in resultant leakage current flowing through the insulating structure 18. In the prototype of FIG. 7, the processor 16 also receives input from a temperature sensor 48 and a humidity sensor 50 located in the vicinity of the insulating structure for sensing the temperature and humidity of the air around the insulating structure. Input received from the temperature and humidity sensors may also be displayed on or more of the dissemination interfaces 32. The processor 16 includes a serial port to communicate with the peripherals such as the dissemination interfaces 32 and/or input device(s).

The following paragraphs describe arrangement and use of the apparatus 10 for measuring leakage current flowing through various forms of insulating structures. In these embodiments, most operative components of the apparatus 10 are housed within the housing 34. The apparatus 10 is generally connected in series between the insulating member 18 and ground G in order to measure and process the composite DC current flowing through the insulating structure 18. As stated above, in some embodiment, the apparatus 10 may be used for real-time monitoring of current leaking through one or more insulating structures which are electrically coupled to a high voltage energized conductor.

Figure 8:
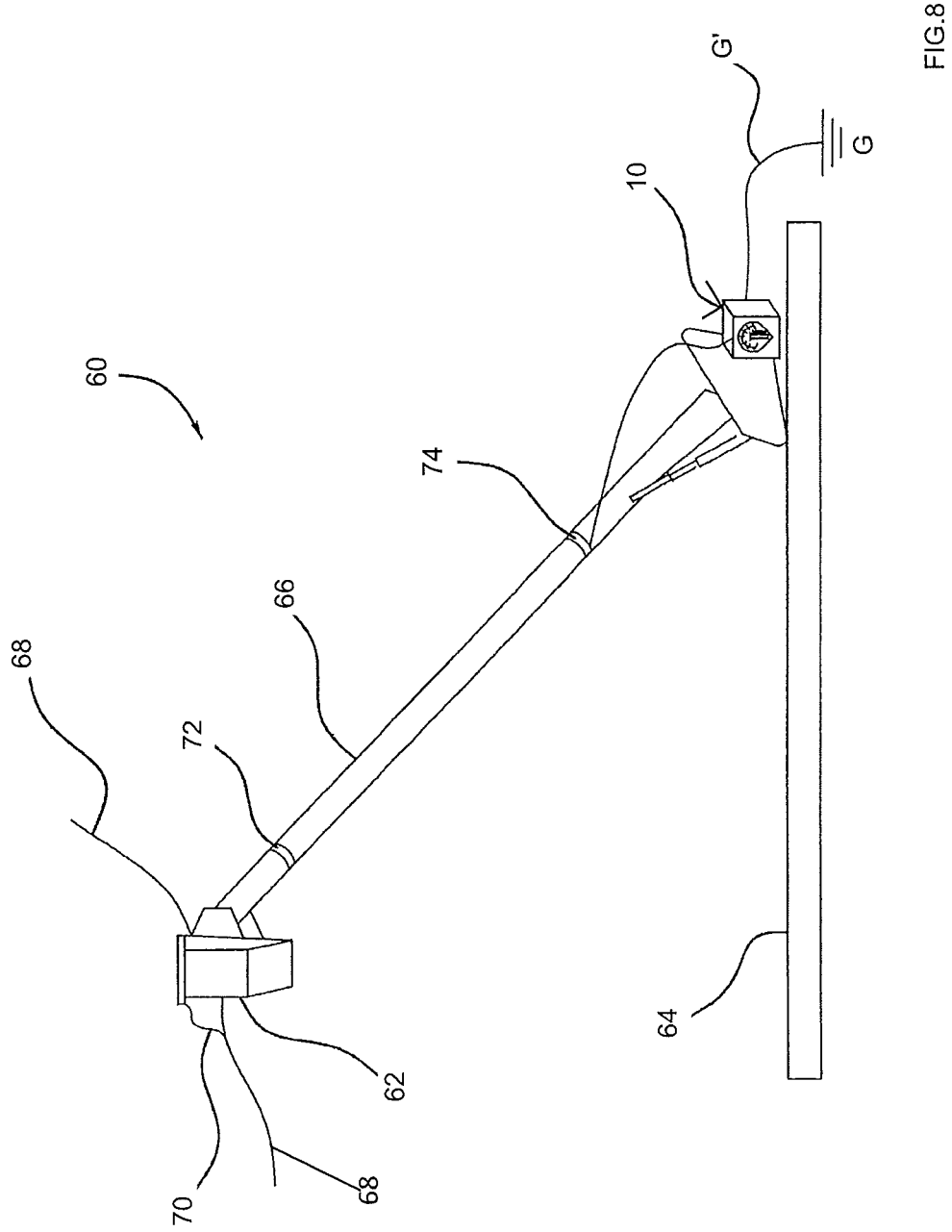
FIG. 8 is a perspective view of the apparatus of FIG. 6 located in an in-use location to monitor current leaking through an insulated boom electrically coupled to an energized high voltage conductor.

FIG. 8 depicts the apparatus 10 in an in-use position with an aerial lift device 60 equipped with a bucket 62 for human occupants. The aerial lift device 60 may be mounted to a truck, vehicle, or trailer chassis 64, or similar platform, the chassis 64 may or may not have wheels. When the apparatus 10 is in use, a boom 66, which may be a fixed length, or extendable in a telescoping fashion, may be extended such that bucket 62 resides beside an energized (i.e. live) high voltage direct current power line 68 so that human occupants within the bucket 62 can perform maintenance on, or further construct, the high voltage direct current power line 68. When the apparatus 10 is in use, the bucket 62, which may be constructed with metallic components, is placed at the same potential (i.e. voltage) as the DC power line 68. Similarly, a human occupant within the bucket 62 is also placed at the same potential as the DC power line 68. In order to place the bucket 62 and any human occupant within the bucket 62 at the same potential as the DC power line 68, a bonding clamp 70 is used. Bonding clamp 70 provides an electrical link between the bucket 62 and the DC power line 68 for the bucket 62 and the human occupants to achieve the potential of the DC power line 68. Bucket 62 is pivotably attached to the telescoping boom 66 to permit relative motion between the bucket 62 and the telescoping boom 66. Telescoping boom 66 is an electrically insulating member made from fiberglass, or fiberglass and other non-conductive materials, which may include plastics and other materials.

Figure 9:
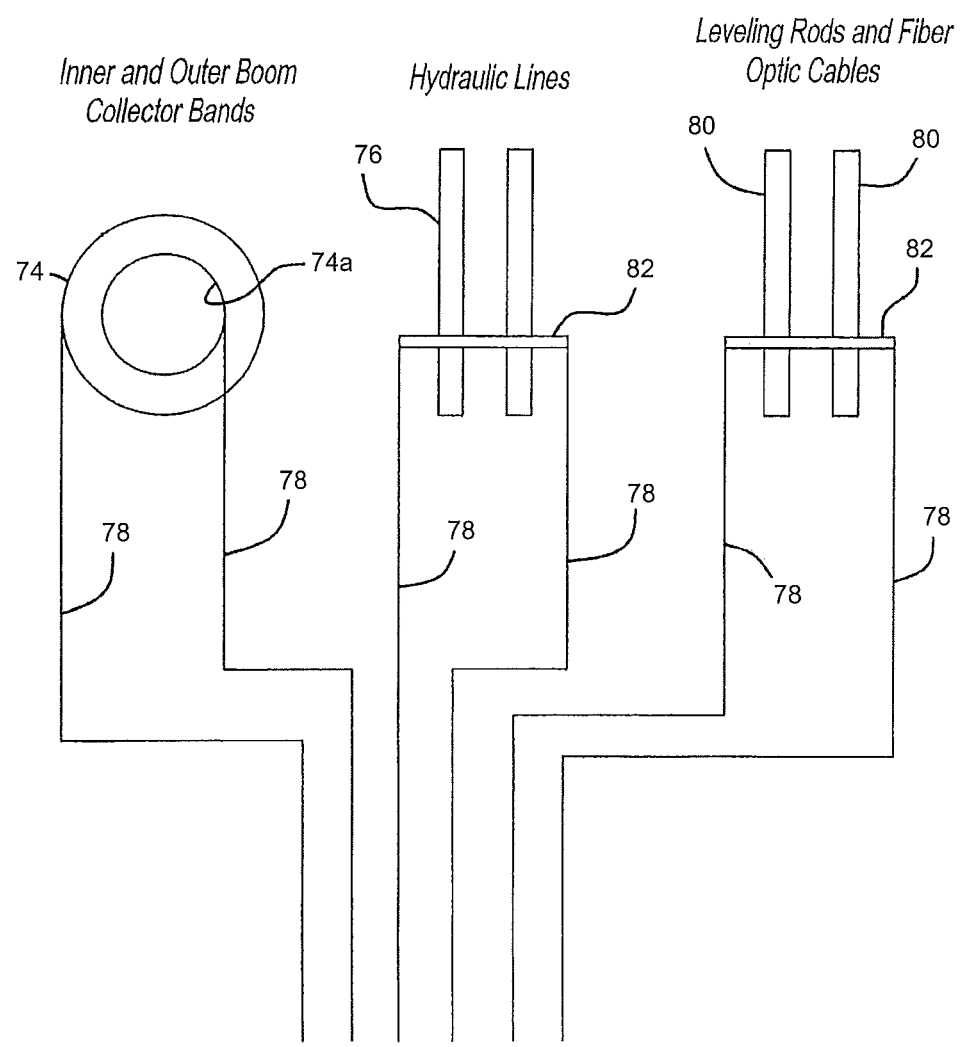
FIG. 9 is a diagram depicting insulating components to which the apparatus of FIG. 6 may be electrically coupled to in order to monitor current leaking through them.

Continuing with FIG. 8, mounted to the telescoping boom proximate to the bucket 62 is a corona ring 72. Corona ring 72 may be mounted within three meters or within three yards of the junction of boom 66 and the bucket 62, or where most electrically advantageous. At an opposite end of boom 66, proximate a truck chassis 68 or other mounting platform or lowest pivot point of boom 66, an outer collector band 74 and an inner collector band 74a (seen in FIG. 9) may be mounted to and against, an exterior and an interior, respectively of boom 66. Boom 66 may be hollow and used as a conduit or passageway for components depicted in FIG. 9, such as one or more hydraulic lines 76, electric lines 78, and one or more fiber optic cables 80. As also depicted in FIG. 9, electric lines 78 may traverse through the boom interior or may traverse or run along some length of an exterior surface or interior surface of boom 66. At a base of the boom 66, one or more electrical collectors 82 (FIG. 9a) may exist for all insulating structures being monitored for current flow. The current sensing circuit 20 may sense the composite DC current flowing through the one or more collectors for input to the waveform separator 12. Each of hydraulic lines 76, fiber optic cables 80, and boom 66 are made of a dielectric material and have electrical insulating qualities. However, as stated above, even dielectric and insulating materials will permit some relative quantity of current to pass, and the apparatus 10 is designed to detect that level of current.

Figure 9A:
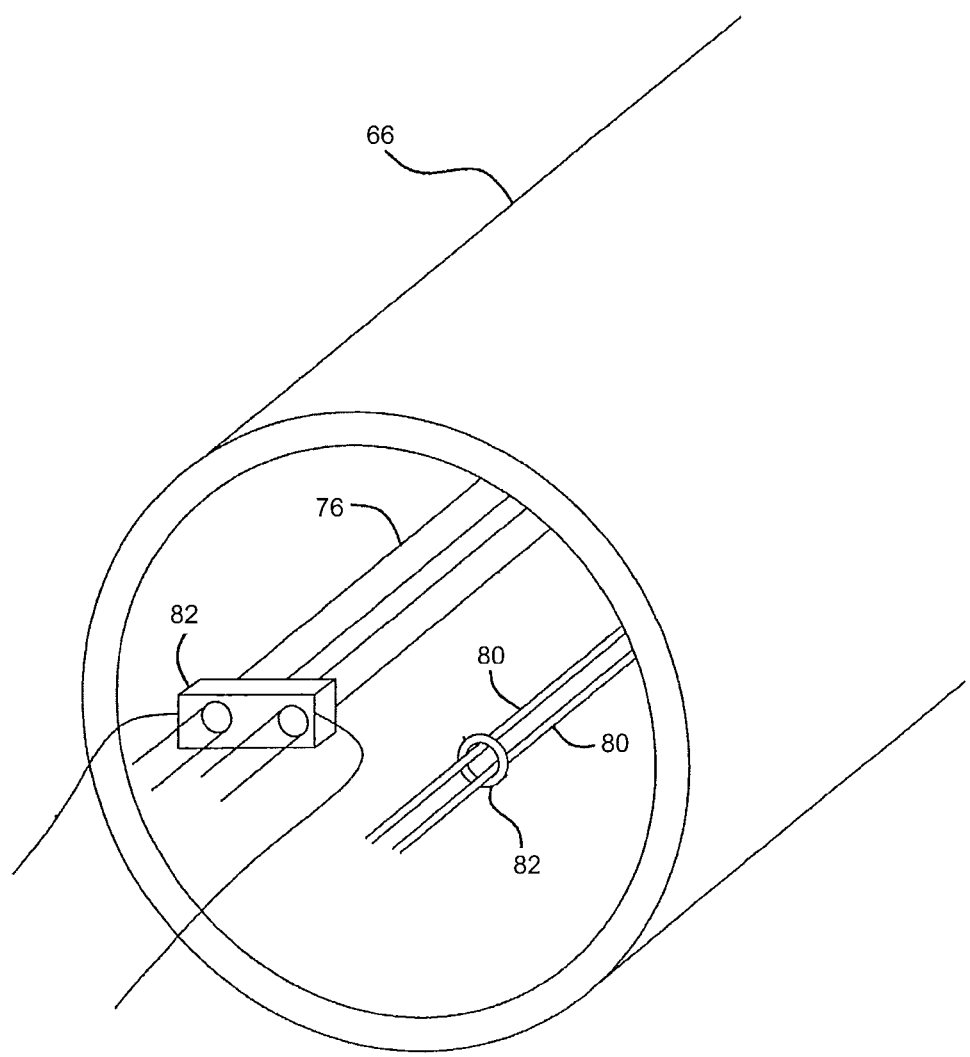
FIG. 9a is an interior view of the insulated boom of FIG. 8 showing location of one or more of the insulating components depicted in FIG. 9.

FIG. 9a is a perspective view of how hydraulic lines 76 and fiber optic cables 80 may reside within an interior of the boom 20. Additionally, FIG. 9a shows electrical collectors 82. Collectors 82 are electrically conductive and may be in the form of a clamp such as the one shown in FIG. 9a surrounding fiber optic cables 80.

Figure 10:
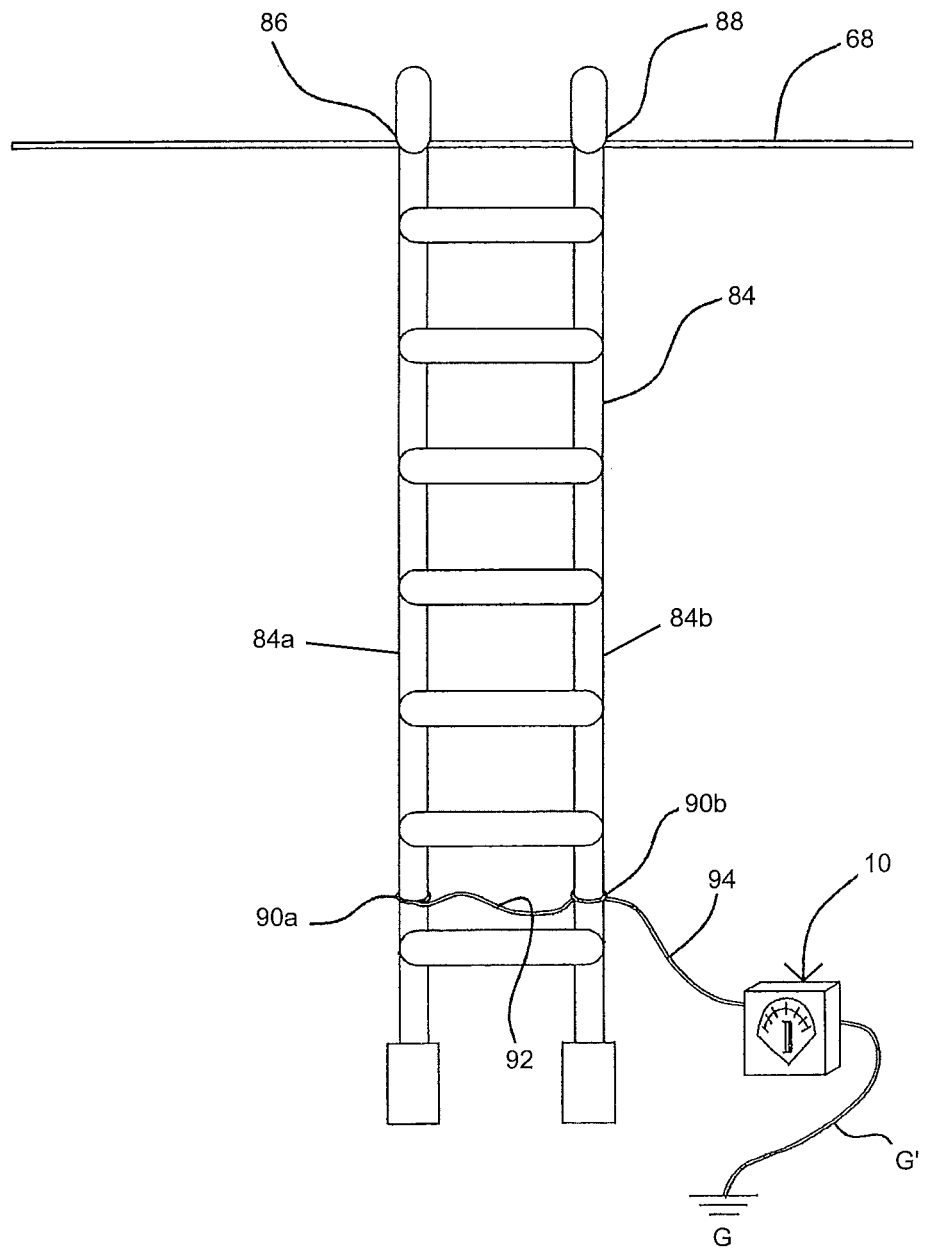
FIG. 10 is a view of an insulating ladder arranged in contact with an energized high voltage conductor and the apparatus of FIG. 6 for measuring DC current leaking through the insulating ladder.

FIG. 10 depicts an insulating ladder 84 arranged in contact with the energized electrical conductor 68 at contact points 86 and 88, and the apparatus 10 is electrically connected to insulating ladder 84. At the opposite end of the insulating ladder 84, a first electrically conductive clamping ring 90a surrounds and contacts a first ladder leg 84a, and a second electrically conductive clamping ring 90b surrounds and contacts a second ladder leg 84b. A clamp ring jumper wire 92 electrically connects to each of first electrically conductive clamping ring 90a and second electrically conductive clamping ring 90b. Although either electrically conductive clamping ring 90a or 90b may be used, FIG. 10 depicts a lead in wire 94 for conducting current from each of first electrically conductive clamping ring 90a and second electrically conductive clamping ring 90b to the apparatus 10. The arrangement of FIG. 10 permits the apparatus 10 to detect current leaking through the insulating ladder 84 and to ground G via ground wire G'.

Figure 11:
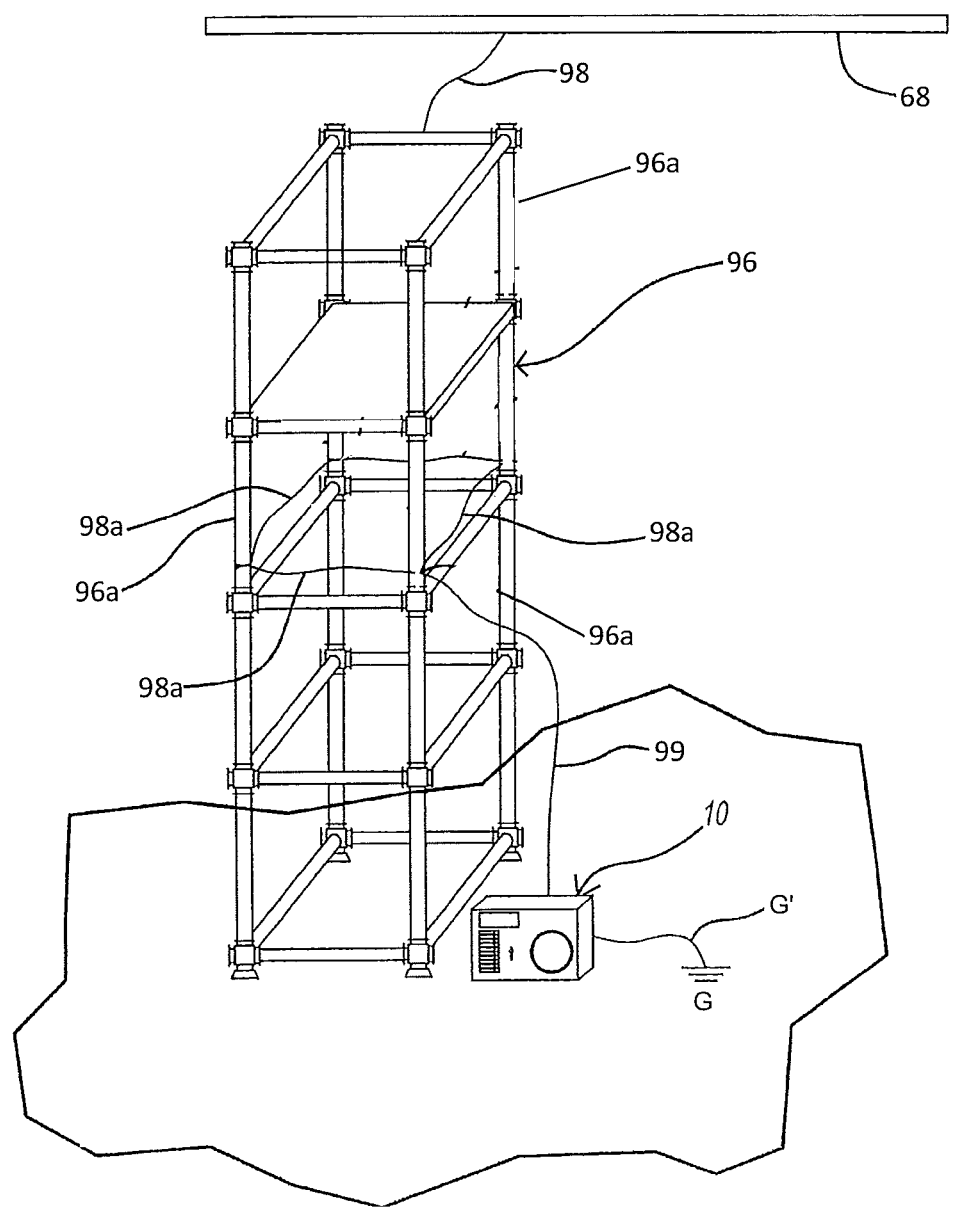
FIG. 11 is a view of an insulating scaffolding arranged in contact with an energized high voltage conductor and the apparatus of FIG. 6 for measuring DC current leaking through the insulating scaffolding.

FIG. 11 depicts another embodiment in which an insulating scaffolding 96 is arranged in physical and electrical contact with the energized DC conductor 68, such as with an electrical jumper 98. The apparatus 10 may be electrically connected to the insulating scaffolding 96 to monitor current leaking through the insulating scaffolding 96. More specifically, in a given horizontal plane at some distance from either an underlying surface such as ground G upon which the insulating scaffolding 96 may reside, or at some distance from the energized DC conductor 68, each of vertical posts 96a passing through such horizontal plane are electrically connected with an electrically conductive wire 98a or multiple pieces of electrically conductive wire 98a. Electrically conductive wire 98a may be secured against each vertical post 96a by an electrically conductive clamp ring to permit a continuous electrical loop of electrically conductive wire 98a. Thus, a continuous loop from vertical pole to vertical pole around insulating scaffolding 96 is created. From one of the sections of the electrically conductive wire 98a, a lead in wire 99 is connected to create an electrically conductive link from the electrically conductive wire 98 to the apparatus 10. The arrangement of FIG. 11 will measure leakage current flowing through the insulating scaffolding and into ground G via the ground wire G'.

Figure 12:
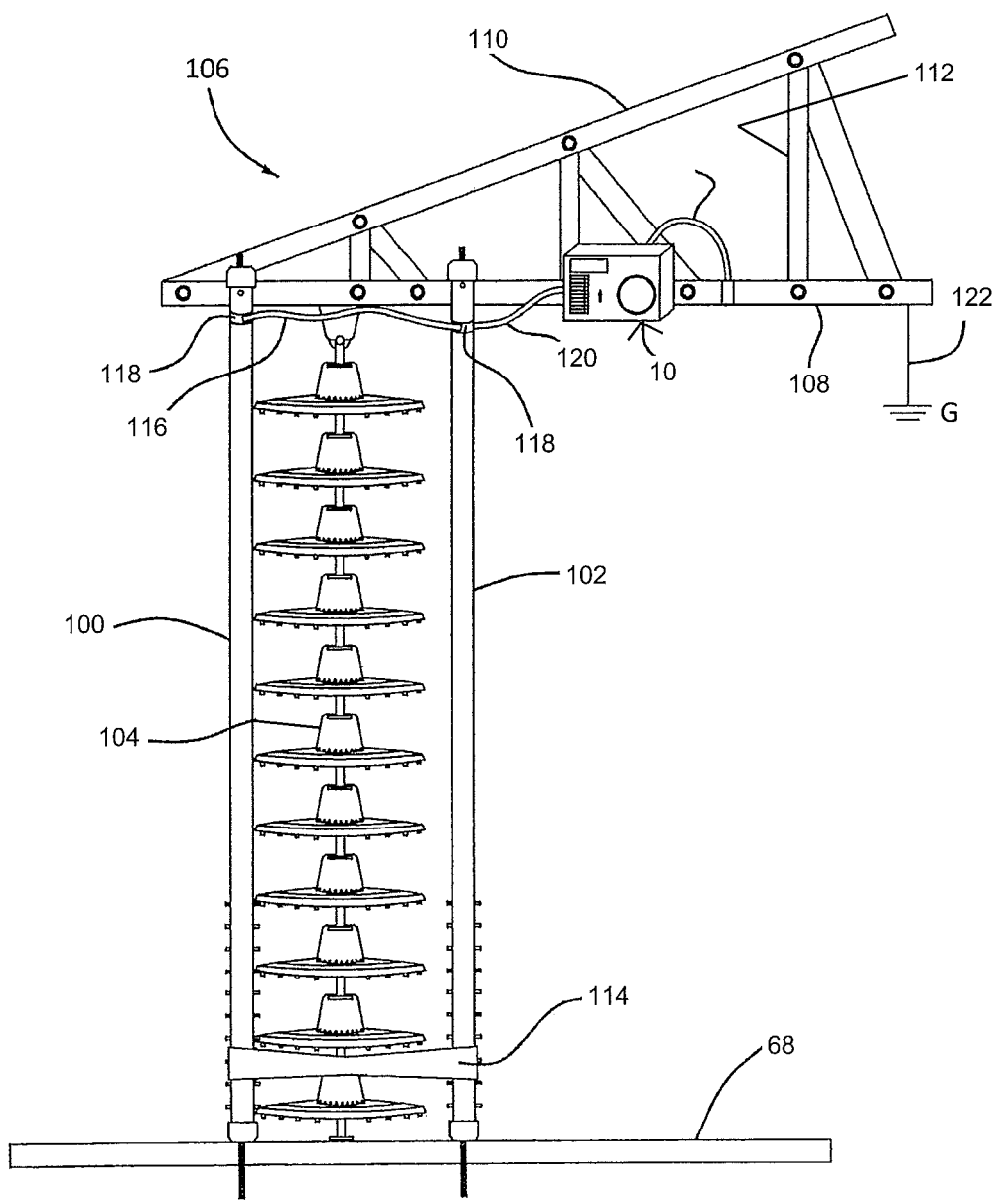
FIG. 12 is a view of an insulating hot stick used during replacement of an outdoor insulator associated with an energized high voltage conductor, the apparatus of FIG. 6 being electrically coupled to the system for measuring current leaking through the insulating components of the system.

FIG. 12 depicts a first insulating hot stick 100 and a second insulating hot stick 102 used during replacement of an outdoor insulator 104 on the energized power line 68, and placement of the apparatus 10 during use of such replacement. A hot stick is a name used by professionals engaged in the trade of maintaining, constructing and reconstructing energized, or live, DC power lines, for specific types of insulated poles, which are also tools, and usually made of fiberglass, or fiberglass and other insulating material(s). The insulating materials prevent, for practical purposes, electrical current from traveling from an energized power line such as DC power line 68 to ground G.

Continuing with FIG. 12, use of the apparatus 10 during a typical scenario involving replacement of an aged or otherwise compromised insulator such as insulator 104 may involve a conductor supporting structure 106, such as part of a lattice tower or any powerline supporting structure that is grounded and thus at the potential of ground G (i.e. in the industry known as ground potential). As part of the conductor supporting structure 106, FIG. 12 depicts an approximately horizontal, or horizontal beam 108, with, relative to horizontal beam 108, an angled beam 110. Horizontal beam and angled beam are joined by connective structures 112 to increase strength. With first insulating hot stick 100 and second insulating hot stick 102 attached to the conductor supporting structure 106, such as to horizontal beam 108, first insulating hot stick 100 and second insulating hot stick 102 hang to the same or approximately the same length as the insulator 104. First insulating hot stick 100 and the second insulating hot stick 102 may be separated at a specified distance by a limiting bracket 114. Each of first insulating hot stick 100 and a second insulating hot stick 102 is affixed to the energized DC power line 68 by clamping or some suitable device, and similarly each of the first insulating hot stick 100 and the second insulating hot stick 102 is affixed to the horizontal beam 108 by clamping or some suitable device. Limiting bracket 114 may be located proximate to the energized DC power line 68. When the first insulating hot stick 100 and the second insulating hot stick 102 are in place as depicted in FIG. 12, the insulator 104 may be removed and instead of the conductor supporting structure 108, before removal, bearing the tensile load due to gravity of the energized DC power line 68, each of first insulating hot stick 100 and second insulating hot stick 102 bears half the tensile load of the energized DC power line 68.

FIG. 12 also depicts the apparatus 10 affixed in some fashion to the conductor supporting structure 108. Additionally, an electrically conductive jumper 116 located between the first insulating hot stick 100 and second insulating hot stick 102, creates an electrical path between the two sticks. Electrically conductive jumper 116 is securely fastened to each of the first insulating hot stick 100 and second insulating hot stick 102 by an electrically conductive clamp 118 that is consistent to each junction. From one of electrically conductive clamps 118, an electrical lead wire 120 permits current leaking through the system to flow to the apparatus 10. A conductive ground lead 122, clamped to conductor supporting structure 106 with a clamp, completes an electrical current path via the conductor supporting structure 106 to ground G.

As stated above, current measurements may be taken or measured at almost any frequency. An average or resultant leakage current may be calculated after a predetermined number of measurements, such as after 100 or 1000, or some other quantity, and then stored in a memory which may internal or external to the apparatus 10. The resultant leakage current or some quantity or component of the measured and processed leakage current (herein referred to as correlation component or parameter value) may be displayed on the one or more interfaces 32 associated with the apparatus 10.

Over time, dielectric performance of insulating structures may deteriorate. Accordingly, resultant leakage current or some predetermined quantity or component thereof, may increase from a first value to a second value. As stated above, the apparatus 10 may be used to monitor and disseminate such trends in leakage current values on a real-time basis so as to alert workers or operators of the increasing intensity of the leakage current flowing through the insulating structures.

In one embodiment, resultant leakage current or any component thereof may be associated with three zones of operation, a safe zone, a caution zone and a danger zone. In the safe zone, the leakage current is within a permissible range. In the caution zone, the resultant leakage current is outside the safe zone but is not within an impermissible range. Caution zone values do not necessarily constitute a dangerous situation. In the danger zone, the resultant leakage current is within the impermissible range. Danger zone is generally indicative of an impending, flashover condition. Danger zone indicates that insulation integrity has been compromised. As one of skill in the art will understand, danger zone limits would be several orders of magnitude below the actual flashover threshold of the insulating live line structure to provide additional warning time and an adequate safety factor for the workers to remove themselves from the insulating structure and/or take steps to stop or reduce the amount of current passing to the ground 50. The threshold for the safe, caution and danger zones for a DC voltage class or range may be derived from historic values representative of fault conditions such as an impending flashover condition for that class. Safe zone limits will vary based upon the DC voltage range or precise DC voltage of a power line to which the apparatus is operably coupled to.

In one embodiment, leakage current values in the safe zone (e.g. green) may be graphically displayed by a series of green bars along with the given value. Leakage current values may be displayed through colored lights, a physical graph, or any other graphical display of intensity. In one embodiment, caution (e.g. yellow) and danger zone (e.g. red) leakage current values are also displayed. However, values in the caution and danger zones may also be accompanied by an audible or visual warning signal of some type to alert the operator to the presence of increasing intensity of the leakage current.

The resultant leakage current values determined by the apparatus described herein may be plotted on a graph. Alternatively, an array of information could be compiled and stored, such as in a database in the memory associated with the apparatus 10. The measurements of current and their duration may be stored in the memory as a series of integers (or values) over a given time period. The database may include columns of information including, but not limited to, time (e.g. seconds or microseconds), amperage reading of the DC composite current (e.g. micro amps) at a time interval (e.g. every $\frac{1}{60}$ of a second, every $\frac{1}{100}$th of a second, every $\frac{1}{120}$th of a second), amperage reading of the resultant leakage current (e.g. micro amps) and average amperage value of the resultant leakage current over a predetermined time period (e.g. every second, every ten seconds). As an example, average amperage value of the resultant leakage current for a predetermined number of readings, or an average amperage value over a predetermined time period may be displayed on the displays associated with the apparatus 10 for visual inspection by viewer or user of the apparatus 10. Still yet, instead of displaying a numerical value on a display, a graphical representation may simultaneously be displayed or instead be displayed. A graphical representation may be a continuously changing bar graph that graphically displays an amperage value of the resultant leakage current.

In order to optimize usage of the memory, any "old" or past-relevant historical recorded and displayed resultant leakage current values may be deleted from the memory associated with the apparatus in order to provide the user or worker with newer, more relevant data as to the present or instantaneous insulating properties or condition of the insulating structure 18.

What is claimed is:

1. A waveform separator system for determining DC leakage current flowing through an insulating structure in a high voltage direct current power system wherein the DC leakage current is a composite DC current comprising one or more high magnitude momentary spikes, and having a DC component and an AC component, the system comprising:
   a waveform separator configured to receive the composite DC current flowing through the insulating structure and to separate the composite DC current into corresponding direct current (DC) and alternating current (AC)

component wherein the AC component has a first rate of change, and wherein the DC component has a second rate of change, and wherein the first rate of change is greater than the second rate of change;

at least one comparator configured to receive the AC component and produce at least one corresponding digital signal; and a processor configured to:
(a) receive the at least one corresponding digital signal and the DC component,
(b) analyze the at least one corresponding digital signal and the DC component, and
(c) determine a resultant leakage current flowing through the insulating structure, further comprising at least one amplifier for amplifying the AC component and the DC component;

wherein the AC component comprises one or more positive components and one or more negative components and wherein the system further comprises at least one positive voltage comparator for counting the one or more positive components and at least one negative voltage comparator for counting the one or more negative components for producing at least one positive digital signal corresponding to the counted one or more positive components and a negative digital signal corresponding to the counted one or more negative components.

2. The system of claim 1 further comprising a current sensing circuit which, when operatively coupled to the insulating structure and the waveform separator, senses the composite DC current flowing through the insulating structure and feeds a voltage value corresponding to the sensed current to the waveform separator.

3. The system of claim 2, wherein the current sensing circuit includes one or more shunts or shunt resistors.

4. The system of claim 1, wherein the waveform separator comprises at least one filter circuit for separating the DC component from the AC component in the sensed DC current.

5. The system of claim 1 further comprising an averaging circuit to average the slow moving DC component over time before the DC component is fed to the at least one amplifier.

6. The system of claim 1, wherein the DC component is substantially steady.

7. The system of claim 1, wherein the processor is further configured to: (a) determine a correlation component from the resultant leakage current, and (b) compare the correlation component against a threshold value and to generate a comparison result signal indicative of a fault if the correlation component exceeds the threshold value.

8. The system of claim 7 further comprising a response means for receiving said comparison result signal and disseminating it through at least one dissemination interface.

9. The system of claim 7, wherein the correlation component is a peak value or RMS value of the resultant leakage current.

10. The system of claim 7, wherein the fault is reduced dielectric performance.

11. The system of claim 7, wherein the fault is an impending flashover condition.

12. The system of claim 8, wherein said dissemination at least one comprises haptic, tactile, or sensory information.

13. The system of claim 8, wherein one or more components of the apparatus are located in a portable housing.

14. The system of claim 13, wherein the at least one dissemination interface is associated with the housing.

15. The system of claim 14, wherein the at least one dissemination interface is a graphical display configured to indicate at least the resultant leakage current.

16. The system of claim 13, wherein the one or more components include the current sensing circuit, the waveform separator, the at least one comparator and the processor.

17. The system of claim 13, wherein the one or more components include the current sensing circuit, the waveform separator and the at least one comparator.

18. The system of claim 17, wherein the housing further includes a communicator to transfer and receive data to and from the processor.

* * * * *